United States Patent
Iizuka et al.

(10) Patent No.: US 10,504,696 B2
(45) Date of Patent: Dec. 10, 2019

(54) MULTI CHARGED PARTICLE BEAM WRITING APPARATUS AND MULTI CHARGED PARTICLE BEAM WRITING METHOD

(71) Applicant: NuFlare Technology, Inc., Yokohama (JP)

(72) Inventors: Osamu Iizuka, Yokohama (JP); Yukitaka Shimizu, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 70 days.

(21) Appl. No.: 15/806,564

(22) Filed: Nov. 8, 2017

(65) Prior Publication Data
US 2018/0138012 A1    May 17, 2018

(30) Foreign Application Priority Data

Nov. 11, 2016 (JP) ................................ 2016-220801

(51) Int. Cl.
*H01J 37/00* (2006.01)
*H01J 37/317* (2006.01)
(Continued)

(52) U.S. Cl.
CPC ........ *H01J 37/3177* (2013.01); *H01J 37/045* (2013.01); *H01J 37/147* (2013.01);
(Continued)

(58) Field of Classification Search
CPC ...... H01J 37/3177; H01J 37/20; H01J 37/244; H01J 37/3023; H01J 37/045; H01J 37/147;
(Continued)

(56) References Cited

U.S. PATENT DOCUMENTS 7,034,321 B2 * 4/2006 Takakuwa .............. B82Y 10/00
                                                        250/397
9,082,588 B2 * 7/2015 Matsumoto ......... H01J 37/3177
(Continued)

FOREIGN PATENT DOCUMENTS

JP    10-261566 A    9/1998
JP    2004-200549    7/2004
(Continued)

OTHER PUBLICATIONS

Office Action and Search Report dated Mar. 8, 2019 in the corresponding Taiwanese Patent Application No. 106134332 with Unedited Computer-Generated English Translation and Translation of Category of Cited Documents citing document AO therein 9 pages.
(Continued)

*Primary Examiner* — Michael Maskell
(74) *Attorney, Agent, or Firm* — Oblon, McClelland, Maier & Neustadt, L.L.P.

(57) ABSTRACT

In one embodiment, a multi charged particle beam writing apparatus includes an aperture plate having a plurality of holes to form multiple beams, a blanking aperture array having a plurality of blankers which switch ON-OFF of corresponding respective beams among the multiple beams, a stage on which a writing target substrate is placed, an inspection aperture provided on the stage and that allows one beam among the multiple beams to pass therethrough, a deflector deflecting the multiple beams, a current detector detecting a beam current of each of the multiple beams that has passed through the inspection aperture in a case where the multiple beams are scanned on the inspection aperture, and a control computing machine that generates a beam image based on the detected beam current and detects a defect of the blanking aperture array or the aperture plate based on the beam image.

18 Claims, 9 Drawing Sheets

(51) Int. Cl.
*H01J 37/04* (2006.01)
*H01J 37/147* (2006.01)
*H01J 37/20* (2006.01)
*H01J 37/244* (2006.01)
*H01J 37/302* (2006.01)

(52) U.S. Cl.
CPC ............ *H01J 37/20* (2013.01); *H01J 37/244* (2013.01); *H01J 37/3023* (2013.01); *H01J 2237/0435* (2013.01); *H01J 2237/0453* (2013.01); *H01J 2237/24564* (2013.01); *H01J 2237/24592* (2013.01); *H01J 2237/31774* (2013.01); *H01J 2237/31798* (2013.01)

(58) Field of Classification Search
CPC ....... H01J 2237/0435; H01J 2237/0453; H01J 2237/24564; H01J 2237/24592; H01J 2237/31774; H01J 2237/31798
USPC ............. 250/306, 307, 310, 311, 396 R–398

See application file for complete search history.

(56) References Cited

U.S. PATENT DOCUMENTS

2004/0135102 A1* 7/2004 Muraki .................. B82Y 10/00
250/492.22
2014/0065547 A1* 3/2014 Arita ................... H01J 37/3177
430/296

FOREIGN PATENT DOCUMENTS

| JP | 2006-79911 A | 3/2006 |
| JP | 2006-186125 | 7/2006 |
| JP | 2006-210455 | 8/2006 |
| JP | 2006-287013 A | 10/2006 |
| JP | 2008-41890 | 2/2008 |
| JP | 2012-109477 A | 6/2012 |
| JP | 2013-140845 | 7/2013 |

OTHER PUBLICATIONS

Office Action dated Mar. 15, 2019 in the corresponding Korean Patent Application No. 10-2017-0144676 with Unedited Computer-Generated English Translation citing documents AP-AR therein 9 pages.

* cited by examiner

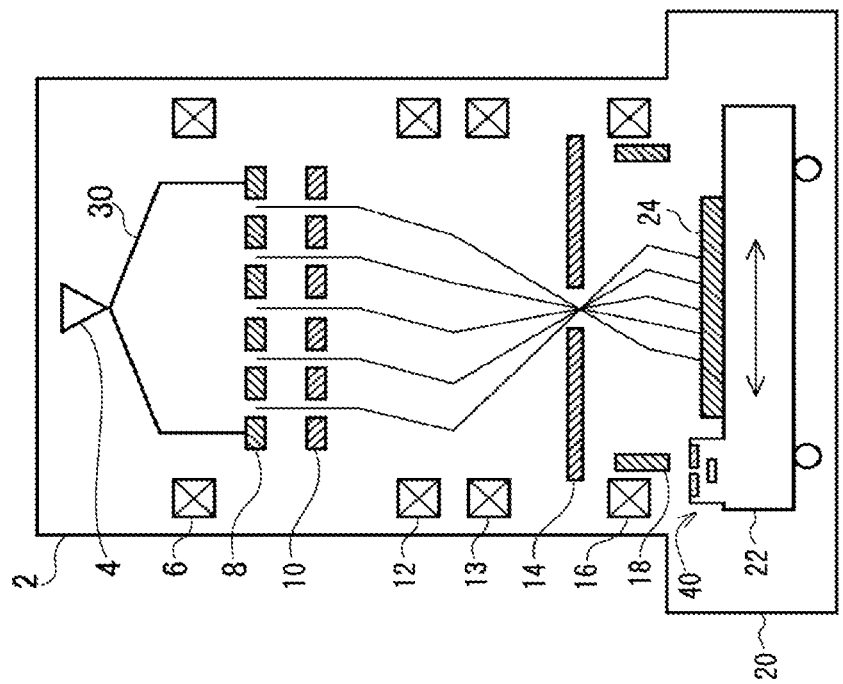
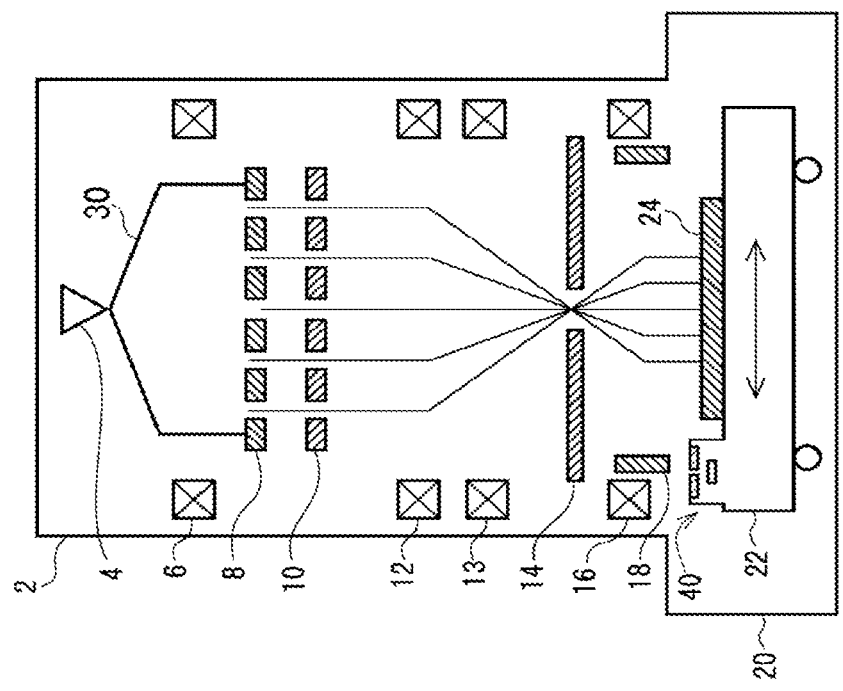

FIG. 9A
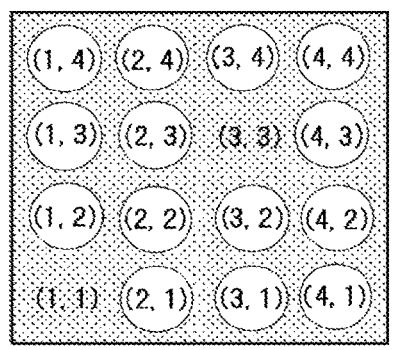
FIG. 9B
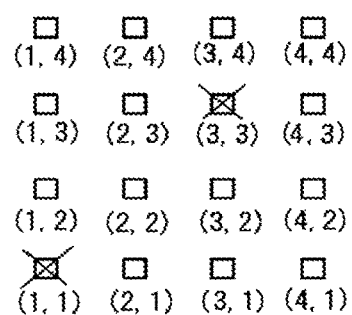
FIG. 9C
| | |
|---|---|
| (1, 1) | 0 |
| (1, 2) | 1 |
| (1, 3) | 1 |
| (1, 4) | 1 |
| (2, 1) | 1 |
| (2, 2) | 1 |
| (2, 3) | 1 |
| (2, 4) | 1 |
| (3, 1) | 1 |
| (3, 2) | 1 |
| (3, 3) | 0 |
| (3, 4) | 1 |
| (4, 1) | 1 |
| (4, 2) | 1 |
| (4, 3) | 1 |
| (4, 4) | 1 |

FIG. 11

|  |  | Always 0V | Always 5V | Closed hole | Normal |
|---|---|---|---|---|---|
| Normal mode | 0 V | ○ | × | × | ○ |
|  | 5 V | ○ | × | × | × |
| Inversion mode | 0 V | × | ○ | × | × |
|  | 5 V | × | ○ | × | ○ |

○ : Beam is detected

× : Beam is not detected

MULTI CHARGED PARTICLE BEAM WRITING APPARATUS AND MULTI CHARGED PARTICLE BEAM WRITING METHOD

CROSS REFERENCE TO RELATED APPLICATION

This application is based upon and claims benefit of priority from the Japanese Patent Application No. 2016-220801, filed on Nov. 11, 2016, the entire contents of which are incorporated herein by reference.

FIELD

The present invention relates to a multi charged particle beam writing apparatus and a multi charged particle beam writing method.

BACKGROUND

As LSI circuits are increasing in density, the line width of circuits of semiconductor devices is becoming finer. Examples of methods of producing an exposure mask (also called a reticle that is used in a stepper or a scanner) to be used to form a circuit pattern for such a semiconductor device include an electron beam writing technique with high resolution.

As an electron beam writing apparatus, a writing apparatus using multiple beams has been developed as a replacement for an existing single beam writing apparatus that deflects one beam and irradiates a necessary location on a substrate with the beam. By using multiple beams, irradiation is possible with more beams than in the case where writing is performed using one electron beam, thus resulting in a significantly improved throughput. In a multibeam writing apparatus, for example, an electron beam emitted from an electron gun is caused to pass through an aperture member having a plurality of holes to form multiple beams, blanking control is performed on each beam at a blanking aperture array, a beam that is not blocked is reduced using an optical system, and a substrate placed on a movable stage is irradiated with the beam.

Checking of whether, for each beam, a beam current or focus has a desired value, whether ON/OFF control can be performed at the blanking aperture array, and so on is desired for the multibeam writing apparatus. Hitherto, beam checking has been performed by scanning a Faraday cup while the beam to be set to ON at the blanking aperture array is switched on a one-by-one basis. However, multiple beams are a number of beams (for example, about 260 thousand beams), and there is a problem in that this checking requires a long period of time if this checking is repeatedly performed for the number of beams.

BRIEF DESCRIPTION OF THE DRAWINGS

FIG. 3A is a diagram for describing a normal mode, and FIG. 3B is a diagram for describing an inversion mode.

FIG. 9A is a diagram illustrating an example of an image obtained by beam scanning, FIG. 9B is a diagram illustrating an example of beam losses, and FIG. 9C is a diagram illustrating an example of a defect list.

FIG. 11 is a diagram illustrating the relationship between the type of defect and whether a beam is detected.

DETAILED DESCRIPTION

In one embodiment, a multi charged particle beam writing apparatus includes an aperture plate in which a plurality of holes are formed and that forms multiple beams in a case where a charged particle beam passes through the plurality of holes, a blanking aperture array in which a plurality of blankers are arranged that switch ON-OFF of corresponding respective beams among the multiple beams, a stage on which a writing target substrate is placed and that is movable in XY directions, an inspection aperture that is provided at the stage and that allows one beam among the multiple beams to pass therethrough, a deflector that deflects the multiple beams, a current detector that detects a beam current of each of the multiple beams that has passed through the inspection aperture in a case where the multiple beams are scanned on the inspection aperture in the XY directions, and a control computing machine that generates a beam image based on the detected beam current and detects a defect of the blanking aperture array or the aperture plate based on the beam image.

Embodiments of the present invention will be described with reference to the drawings.

Figure 1:
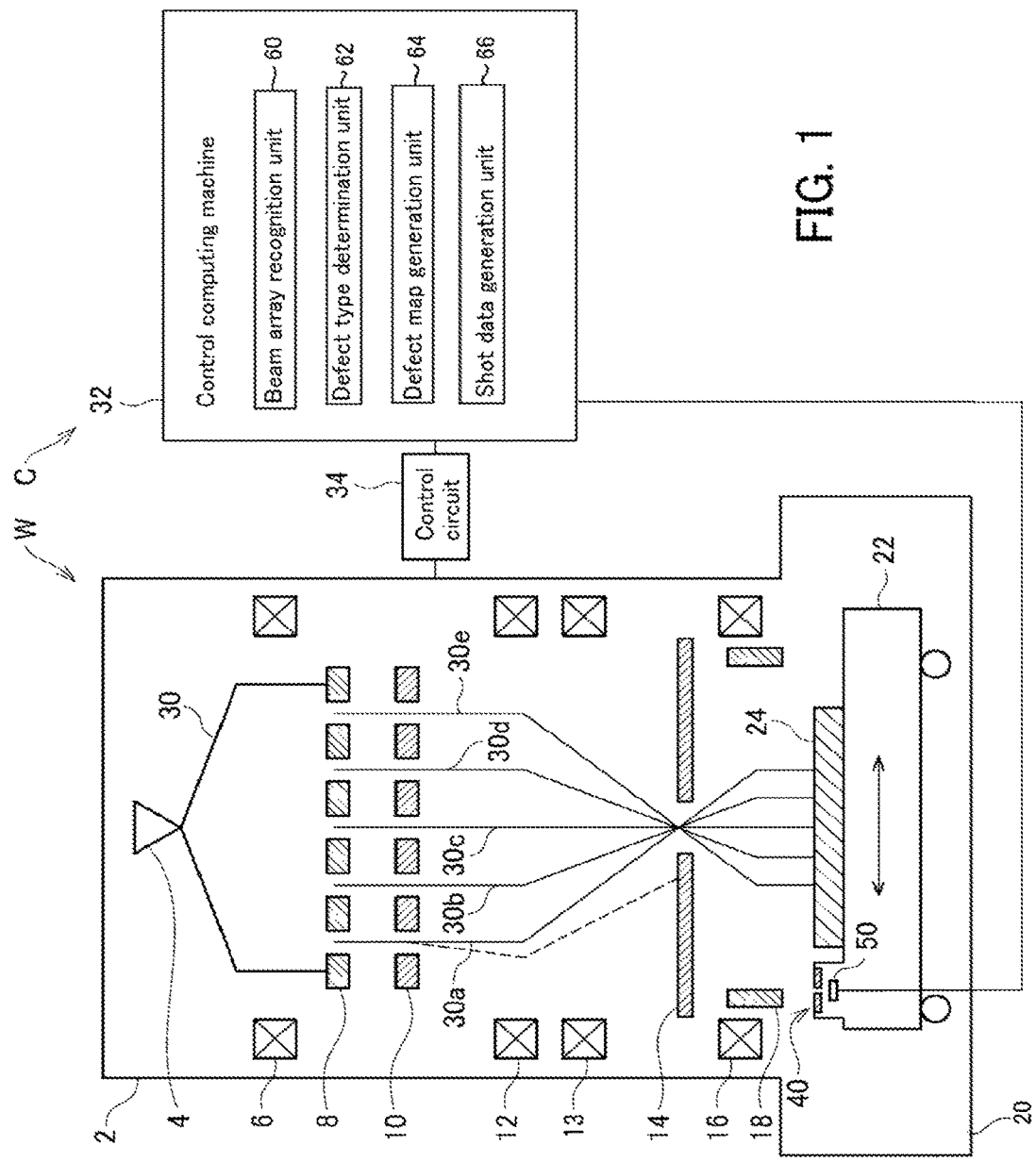
FIG. 1 is a schematic diagram of a multi charged particle beam writing apparatus according to an embodiment of the present invention.

FIG. 1 is a schematic diagram of a multi charged particle beam writing apparatus according to an embodiment of the present invention. In the present embodiment, a configuration using an electron beam as an example of a charged particle beam will be described. Note that the charged particle beam is not limited to an electron beam and may be other charged particle beams such as an ion beam.

This writing apparatus includes a writing unit W that writes a desired pattern by irradiating a writing target substrate 24 with electron beams, and a control unit C that controls the operation of the writing unit W.

The writing unit W has an electron beam column 2 and a writing room 20. An electron gun 4, an illumination lens 6, an aperture member 8, a blanking aperture array 10, a reducing lens 12, an alignment coil 13, a limiting aperture member 14, an object lens 16, and a deflector 18 are arranged in the electron beam column 2.

An XY stage 22 is arranged in the writing room 20. The writing target substrate 24 is placed on the XY stage 22. Examples of the writing target substrate 24 include a wafer and an exposure mask for transferring a pattern onto a wafer using a reduction projection exposure apparatus or an extreme ultraviolet (EUV) exposure apparatus such as a stepper or a scanner, the stepper using an excimer laser as a light source.

In addition, on the XY stage 22, a multibeam-use beam inspection apparatus having a multi-beam inspection aperture 40 (hereinafter described as "inspection aperture 40") and a current detector 50 is arranged at a position different from the position at which the substrate 24 is placed. The height of the inspection aperture 40 is adjustable by an adjustment mechanism (not illustrated). Preferably, the inspection aperture 40 is installed at the same height position as the substrate 24.

Figure 2:
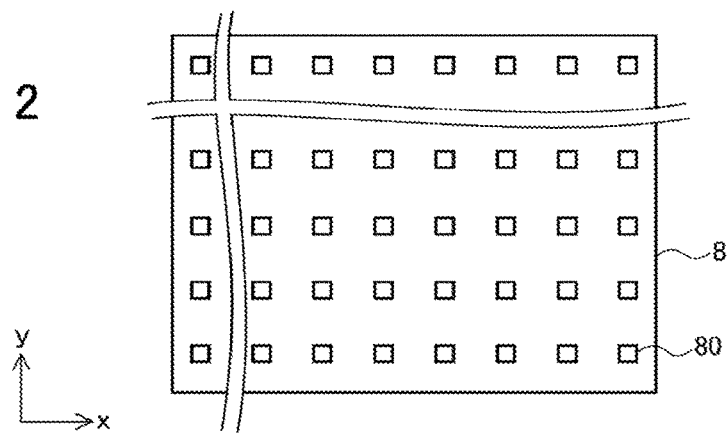
FIG. 2 is a schematic diagram of an aperture member.

An electron beam 30 emitted from the electron gun 4 almost perpendicularly illuminates the entirety of the aperture member 8 (aperture plate) due to the illumination lens 6. FIG. 2 is a schematic diagram illustrating the configuration of the aperture member 8. Holes (openings) 80 that are m vertical columns (y direction) by n horizontal columns (x direction) (m, n≥2) are formed in the aperture member 8 with a predetermined arrangement pitch in a matrix. For example, holes 80 that are 512 columns by 512 columns are formed. Each hole 80 is formed in a rectangular shape having the same dimensions. Each hole 80 may have a circular shape having the same diameter.

The electron beam 30 illuminates a region including all the holes 80 of the aperture member 8. When portions of the electron beam 30 pass through the plurality of respective holes 80, multiple beams 30a to 30e as illustrated in FIG. 1 are formed.

FIG. 2 illustrates the example in which the holes 80, which form two or more columns in the vertical and horizontal directions (x and y directions), are arranged; however the present invention is not limited thereto. For example, there may be a plurality of columns either in the vertical or horizontal direction (x, y direction) and only one column in the other direction.

Through holes are formed in the blanking aperture array 10 so as to correspond to the arrangement positions of the holes 80 of the aperture member 8, and blankers constituted by two electrodes, which are a pair, are arranged at the respective through holes. The electron beams 30a to 30e passing through the respective through holes are deflected independently of each other by voltages applied by the blankers. Each beam is subjected to blanking control by this deflection. The blanking aperture array 10 performs blanking deflection on each of the multiple beams that have passed through the plurality of holes 80 of the aperture member 8.

The beam size and the arrangement pitch of each of the multiple beams 30a to 30e that have passed through the blanking aperture array 10 are reduced by the reducing lens 12, and each beam proceeds toward a center hole formed in the limiting aperture member 14. In a normal mode to be described later, the paths of electron beams deflected by blankers of the blanking aperture array 10 are changed and displaced from the center hole of the limiting aperture member 14 and blocked by the limiting aperture member 14. In contrast, the electron beams that have not been deflected by blankers of the blanking aperture array 10 pass through the center hole of the limiting aperture member 14.

The limiting aperture member 14 blocks the electron beams deflected so as to be in a beam OFF state by the blankers of the blanking aperture array 10. After the state enters beam ON, the beams that have passed through the limiting aperture member 14 until the state enters the beam OFF are a one-shot electron beam.

Focus is achieved by the object lens 16 for the electron beams 30a to 30e that have passed through the limiting aperture member 14, and the electron beams become a pattern image having a desired reduction ratio on the substrate 24. The electron beams (all the multiple beams) that have passed through the limiting aperture member 14 are collectively deflected by the deflector 18 in the same direction, and are applied to the substrate 24.

The alignment coil 13 is provided under the reducing lens 12 (or between the blanking aperture array 10 and the reducing lens 12).

The "normal mode" and an "inversion mode" can be switched by controlling the amount of deflection of electron beams due to the alignment coil 13, in the normal mode the electron beams that are not deflected by the blankers of the blanking aperture array 10 passing through the center hole of the limiting aperture member 14 as illustrated in FIG. 3A, in the inversion mode the electron beams deflected by the blankers of the blanking aperture array 10 passing through the center hole of the limiting aperture member 14 as illustrated in FIG. 3B.

In the "normal mode", the substrate 24 is irradiated with electron beams to which no voltage is applied by blankers of the blanking aperture array 10 and that are not deflected, and electron beams to which a predetermined voltage (for example, 5 V) is applied and that are deflected are blocked by the limiting aperture member 14.

In contrast, in the "inversion mode", the substrate 24 is irradiated with electron beams to which the predetermined voltage (for example, 5 V) is applied by blankers of the blanking aperture array 10 and that are deflected, and electron beams to which no voltage is applied (the applied voltage is 0 V) and that are not deflected are blocked by the limiting aperture member 14.

The multiple beams that are applied at once are ideally aligned with the pitch obtained by multiplying the arrangement pitch of the plurality of holes 80 of the aperture member 8 by the above-described desired reduction ratio. This writing apparatus performs a writing operation using a raster scan method in which shot beams are sequentially applied in order, and when a desired pattern is written, necessary beams are controlled in accordance with the pattern under blanking control so that the beam ON is set. When the XY stage 22 is continuously moving, the deflector 18 performs control such that irradiation positions of the beams follow the movement of the XY stage 22.

The control unit C has a control computing machine 32 and a control circuit 34. The control computing machine 32 has a beam array recognition unit 60, a defect type determination unit 62, a defect map generation unit 64, and a shot data generation unit 66. The units of the control computing machine 32 may be hardware such as an electrical circuit, or may also be software such as a program for executing these functions. In the case where the units are software, the program for realizing these functions may be stored on a recording medium and may be read and executed by a computer including for example an electrical circuit.

The shot data generation unit 66 generates shot data unique to the apparatus by performing multistage data conversion processing on writing data and outputs the shot data to the control circuit 34. In the shot data, for example, the amount of irradiation of each shot and the coordinates of the irradiation position are defined. The control circuit 34 calculates an irradiation time period t by dividing the amount of irradiation of each shot by a current density, and applies, when the corresponding shot is performed, a deflection voltage to corresponding blankers of the blanking aperture array 10 such that the beam ON is set only during the irradiation time period t.

The control circuit 34 calculates the amount of deflection so that each beam is deflected to the position (coordinates) indicated by the shot data, and applies a deflection voltage to the deflector 18. As a result, the multiple beams shot at the session are collectively deflected. In addition, the control circuit 34 controls the amount of beam deflection due to the alignment coil 13, and switches between the normal mode and the inversion mode.

In this writing apparatus, for each of many electron beams constituting the multiple beams, for example, whether the blanker of the blanking aperture array 10 can perform ON/OFF control by applying a desired voltage is inspected. This inspection is performed using the multibeam-use beam inspection apparatus having the inspection aperture 40 and the current detector 50.

Figure 4:
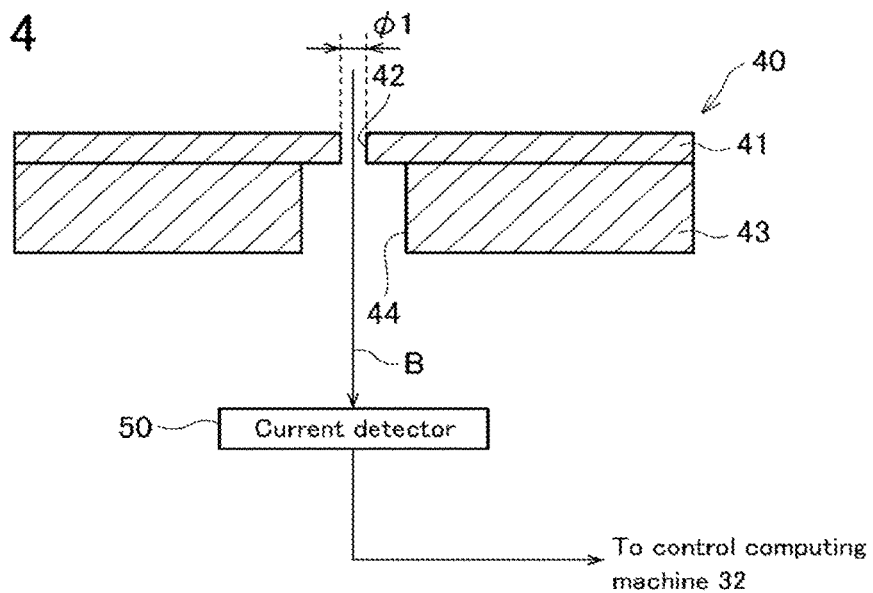
FIG. 4 is a schematic diagram of a beam inspection unit according to the same embodiment.
Figure 5:
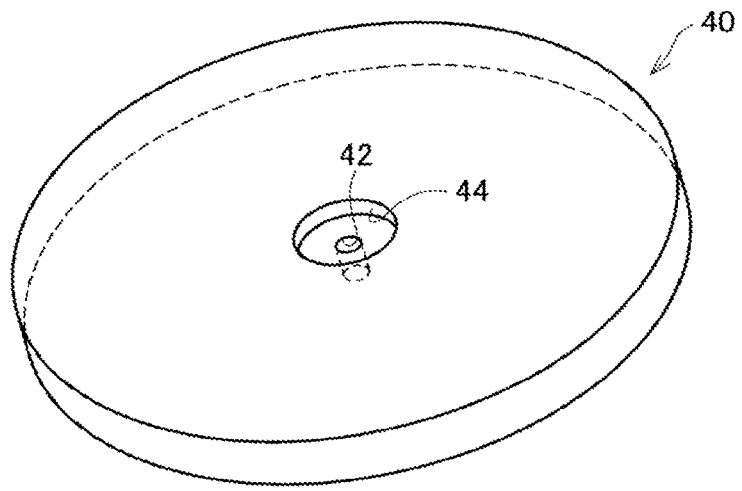
FIG. 5 is a perspective view of a multi-beam inspection aperture according to the same embodiment.
Figure 6:
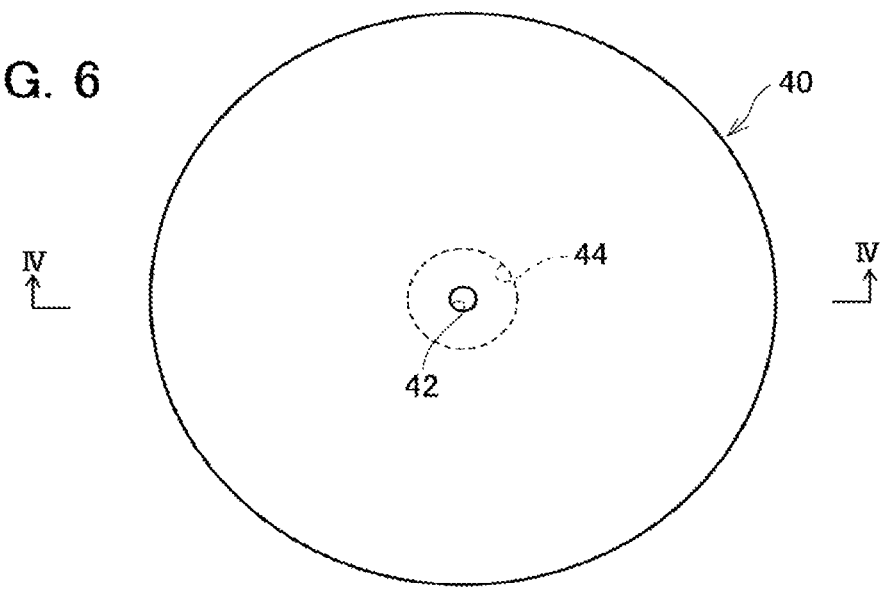
FIG. 6 is a plan view of the multi-beam inspection aperture according to the same embodiment.

The configuration of the multi-beam-use beam inspection apparatus is described using FIGS. 4 to 6. FIG. 4 is a schematic diagram of the configuration of the multi-beam-use beam inspection apparatus. FIG. 5 is a perspective view of the inspection aperture 40 seen from the bottom surface side. FIG. 6 is a plan view of the inspection aperture 40 seen from the top surface side. Note that the inspection aperture 40 illustrated in FIG. 4 is a cut end diagram taken along line IV-IV of FIG. 6.

The inspection aperture 40 places limitations so that only one electron beam passes therethrough, and for example a thing having a scattering layer 41 and an absorption layer 43 can be used. The scattering layer 41 is provided on the absorption layer 43. The inspection aperture 40 has for example a circular planar shape, and a through hole is formed along the central axis. This through hole is formed by an opening 44 formed in the central region of the absorption layer 43 and a through hole 42 formed in the central region of the scattering layer 41 and connecting with the opening 44.

When the inspection aperture 40 is created, for example, a heavy metal thin film with high stopping power such as Pt or W is prepared, and the opening 44 is formed on the bottom surface side by etching using a focused ion beam (FIB). Next, the through hole 42 having a smaller diameter than the opening 44 is formed in the bottom portion of the opening 44 by etching using a FIB. In the heavy metal thin-film, the portion where the opening 44 is formed corresponds to the absorption layer 43 and the portion where the through hole 42 is formed corresponds to the scattering layer 41. Note that the order of processing is not limited to this.

In the case where the beam pitch of the multiple beams on the substrate 24 is P and the size of (one) beam is S, it is preferable that a diameter $\phi 1$ of the through hole 42 be $S<\phi 1<P-S$. When the diameter $\phi 1$ is greater than the beam size S, the entirety of one electron beam can pass through the through hole 42 (transmission without being scattered), and the S/N ratio can be increased. Preferably, the diameter $\phi 1$ is as large as possible in order to make it easier to find a beam and also to prevent the hole from being closed by a foreign matter.

In contrast, when the diameter $\phi 1$ is smaller than $P-S$, when multiple beams are scanned, (portions of) two beams next to each other do not simultaneously pass through the through hole 42. Thus, the through hole 42 can allow only one electron beam among the multiple beams to pass therethrough. For example, as illustrated in FIG. 7, when an electron beam BI passes through the through hole 42, electron beams B2 next to the electron beam BI do not overlap the through hole 42.

Figure 7:
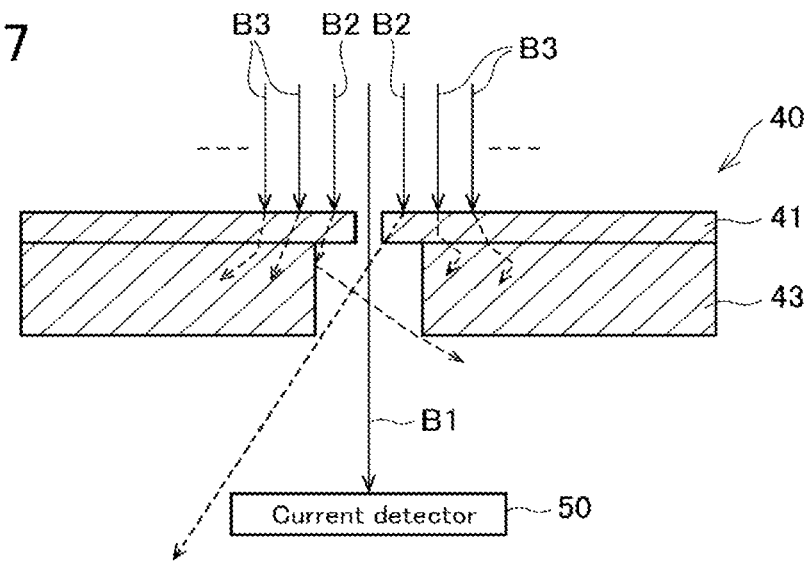
FIG. 7 is a diagram illustrating multiple beams with which the inspection aperture is irradiated.

For example, as illustrated in FIG. 7, when the electron beam BI passes through the through hole 42, the electron beams B2 right next to the electron beam BI (eight electron beams B2 around the electron beam BI) are applied to the scattering layer 41 and partially reflected at the surface of the scattering layer 41, but most of the electron beams B2 enter the scattering layer 41 and are scattered as indicated with broken lines. The scattered electrons pass through the scattering layer 41, some of them simply travel in straight lines in a vacuum, some of them are reflected at the surface of the absorption layer 43, and some of them enter the absorption layer 43, and the scattered electrons (rarely) reach the current detector 50. Electron beams B3 positioned at least one electron beam away from the electron beam BI are scattered in the scattering layer 41. The scattered electrons enter the absorption layer 43 and are absorbed.

Note that the configuration of the inspection aperture 40 is not limited to the above-described configuration, and a thing that can place limitations so that only one electron beam passes therethrough can be used.

The electron beam that has passed through the through hole 42 and the opening 44 (the electron beam B in FIG. 4 and the electron beam B1 in FIG. 7) enters the current detector 50 and a beam current is detected. For example, a solid-state detector (SSD (a semiconductor detector)) can be used as the current detector 50. A detection result from the current detector 50 is reported to the control computing machine 32.

Figure 8:
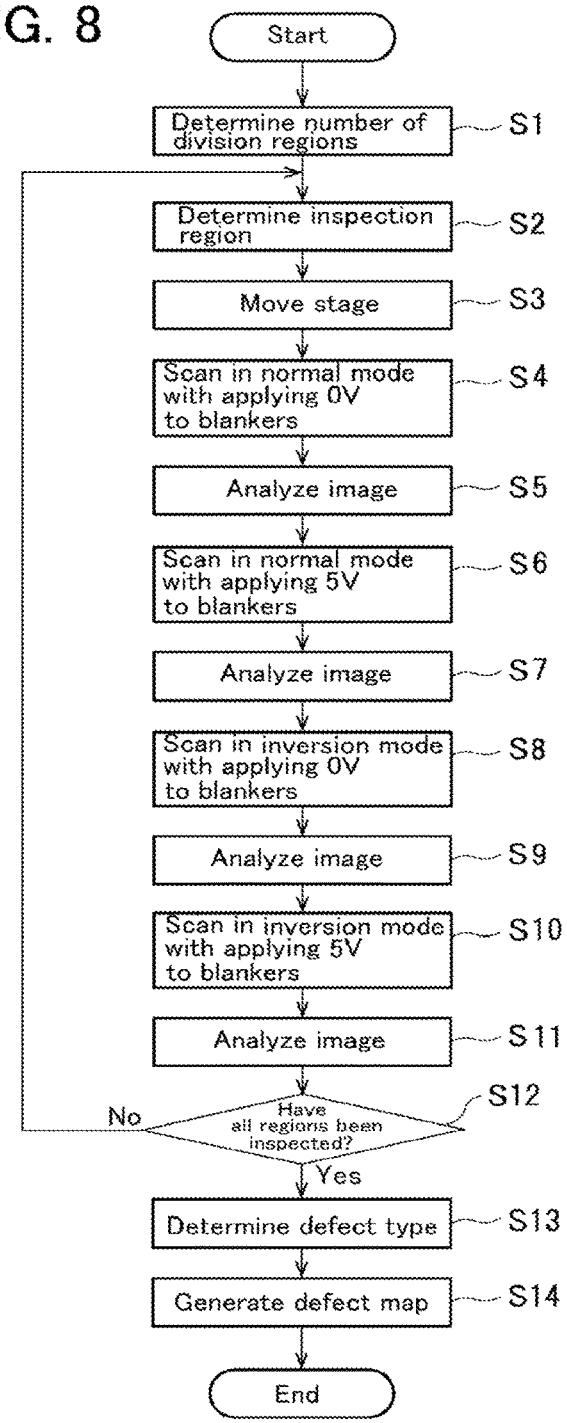
FIG. 8 is a flowchart for describing a multi-beam inspection method according to the same embodiment.

Next, for each of many electron beams constituting the multiple beams, a method for inspecting whether ON/OFF control can normally be performed, for generating a defect map in which defect locations where ON/OFF control cannot be performed are specified, and for determining the types of defect will be described using a flowchart illustrated in FIG. 8.

The types of defect to be determined are, for example, "always ON defect (always 0 V defect)" in which no voltage is applied by a blanker and the substrate 24 is always irradiated with a beam in the normal mode, "always OFF defect" in which the substrate 24 cannot be irradiated with a beam in the normal mode, variations in openings of the holes 80 of the aperture member 8, and so on. The "always OFF defect" is classified into "always 5 V defect" in which an applied voltage of a blanker is fixed to 5 V and "closed hole defect" in which a hole 80 is not opened in the aperture member 8.

In the present embodiment, the blanking aperture array 10 is divided into a plurality of inspection regions, and an inspection (scanning of the inspection aperture 40) is performed on a region basis. This is because the maximum amount of deflection of the deflector 18 to be used for a beam scan is not large enough to cover the entire region of the blanking aperture array 10. Thus, first, the number of division regions, which is n (n is an integer greater than or equal to two), of the blanking aperture array 10 is determined (step S1).

A region for which an inspection has not yet been performed is selected and an inspection region is determined (step S2). The XY stage 22 is moved, and the inspection aperture 40 is arranged at a position where beam irradiation for the inspection region is possible (step S3).

In the normal mode, the applied voltage of the blankers of the inspection region is set to 0 V, the applied voltage of the blankers of the other regions (non-inspection regions) is set to 5 V, a plurality of beams for which the beam ON is set by the blankers of the inspection region are deflected by the deflector 18 in the XY directions, the inspection aperture 40 is scanned, and electron beams passing through the through hole 42 are successively switched (step S4). The current detector 50 detects a beam current.

The control computing machine 32 converts the beam currents detected by the current detector 50 into luminances (brightnesses), generates beam images on the basis of the amount of deflection of the deflector 18, performs an image analysis, and detect beam losses (step S5). For example, beam images as illustrated in FIG. 9A are generated. This is an example of images in the case where the inspection region is a 4×4 array whose lower left is (1, 1).

From this image, (1, 1) and (3, 3) beam losses (always OFF defects) are detected as illustrated in FIG. 9B. A defect list for always OFF defects of the blankers is then generated as illustrated in FIG. 9C.

Figure 10A:
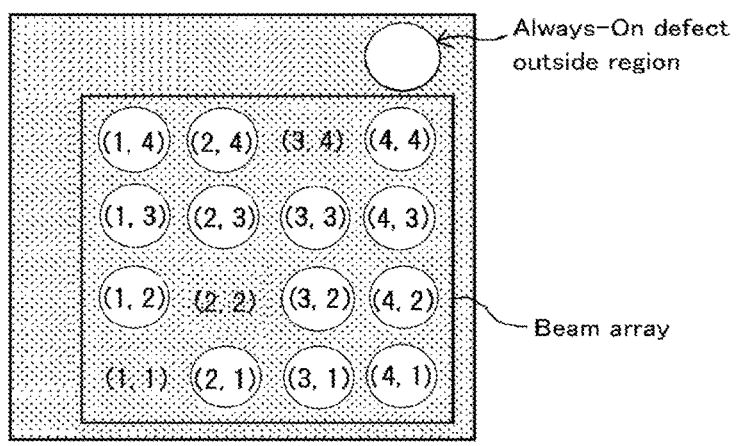
FIGS. 10A and 10B are diagrams illustrating examples of beam array recognition processing.

In the case where an always ON defect beam exists near the inspection region, an image as illustrated in FIG. 10A is obtained. The beam array recognition unit 60 recognizes a beam array region corresponding to the inspection region, and defects outside the region are ignored. For example, since the inspection region has already been determined to be a 4×4 array, the beam array recognition unit 60 recognizes a beam array so that the number of beams included in a region the size of which is a 4×4 array is largest.

Next, the inspection aperture 40 is scanned in a state in which, in the normal mode, the applied voltage of the blankers of the inspection region is set to 5 V, the applied voltage of the blankers of the non-inspection regions is also set to 5 V, and all the beams are set to OFF (step S6). In this case, beam currents of always ON defect beams are detected by the current detector 50.

Figure 10B:
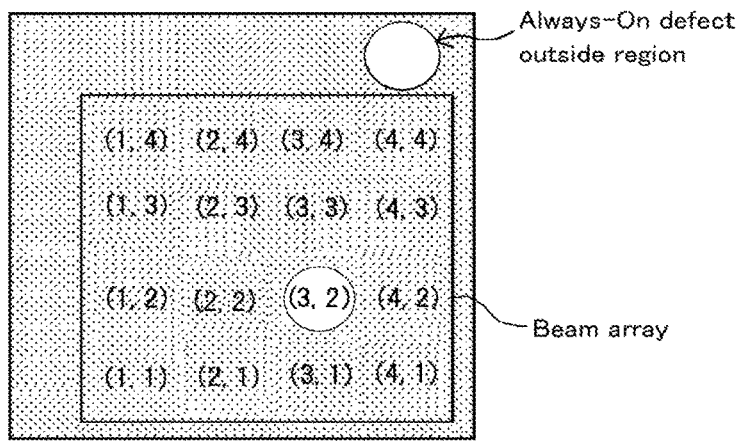

The control computing machine 32 converts the beam currents detected by the current detector 50 into luminances, generates an image on the basis of the amount of deflection of the deflector 18, and generates a defect list for always ON defects by performing an image analysis (step S7). For example, an image as illustrated in FIG. 10B is generated. It is clear from this image that the beam at (3, 2) is an always ON defect beam.

Since the position of the beam array is determined in step S5, a defect outside the region illustrated in FIG. 10B is ignored.

Next, the inspection aperture 40 is scanned in a state in which the amount of deflection of the alignment coil 13 is controlled, the mode is switched to the inversion mode, the applied voltage of the blankers of the inspection region is set to 0 V, the applied voltage of the blankers of the non-inspection region is also set to 0 V, and all the beams are set to OFF (step S8). In this case, beam currents of always 5 V defect beams are detected by the current detector 50.

The control computing machine 32 converts the beam currents detected by the current detector 50 into luminances, generates beam images on the basis of the amount of deflection of the deflector 18, performs an image analysis, and generates a defect list for always 5 V defects (step S9).

Next, in the inversion mode, the applied voltage of the blankers of the inspection region is set to 5 V, the applied voltage of the blankers of the other regions (non-inspection regions) is set to 0 V, a plurality of beams for which the beam ON is set by the blankers of the inspection region are deflected by the deflector 18 in the XY directions, and the inspection aperture 40 is scanned (step S10). The current detector 50 detects beam currents.

The control computing machine 32 converts the beam currents detected by the current detector 50 into luminances, generates an image on the basis of the amount of deflection of the deflector 18, performs an image analysis, and generates a defect list for beam losses (always 0 V defects or closed holes) (step S11).

This inspection is performed on all the n inspection regions of the blanking aperture array 10 (steps S2 to S12).

After all the inspection regions have been inspected, the defect type determination unit 62 compares the image analysis results of the inspection regions and determines the types of defect (step S13).

As illustrated in FIG. 11, in the case where the applied voltage of the blankers of the inspection region is set to 0 V in the normal mode, beams that have passed through blankers that normally operate and always 0 V defect beams are detected.

In the case where the applied voltage of the blankers of the inspection region is set to 5 V in the normal mode, no beam passing through blankers that normally operate is detected and the always 0 V defect (always ON defect) beams are detected.

In the case where the applied voltage of the blankers of the inspection region is set to 0 V in the inversion mode, no beam passing through blankers that normally operate is detected and always 5 V defect beams are detected.

In the case where the applied voltage of the blankers of the inspection region is set to 5 V in the inversion mode, beams that have passed through blankers that normally operate and always 5 V defect beams are detected.

For a closed hole defect in which a hole 80 is not opened in the aperture member 8, no beam is always detected.

Using the relationship as illustrated in FIG. 11, the defect type determination unit 62 detects beam defects and determines the types of the defects on the basis of the applied voltage and operation mode (normal mode/inversion mode) of the blankers and whether a beam is detected. For example, the defect type determination unit 62 determines that an always ON defect (always 0 V defect) has occurred in a blanker corresponding to a beam detected both when the applied voltage of the blanker is 0 V and when the applied voltage of the blanker is 5 V in the normal mode.

In the case where no beam is detected both when the applied voltage of a blanker is 0 V and when the applied voltage of the blanker is 5 V in the normal mode and where a beam is detected both when the applied voltage of the blanker is 0 V and when the applied voltage of the blanker is 5 V in the inversion mode, it is determined that an always 5 V defect has occurred in the blanker corresponding to this beam.

In the case where no beam is detected both when the applied voltage of a blanker is 0 V and when the applied voltage of the blanker is 5 V in both the normal mode and the inversion mode, it is determined that a closed hole defect indicating that a hole 80 that should form this beam is not opened in the aperture member 8 has occurred.

In the case where only always ON defects and always OFF defects need to be determined, inspecting in the inversion mode (steps S8 to S11 of FIG. 8) can be omitted.

The defect type determination unit 62 can determine variations in openings of the holes 80 from the luminance of the beam images. For example, when the opening size of a hole 80 is smaller than a predetermined value, the luminance of the beam image becomes smaller (darker). The defect type determination unit 62 calculates the average of the luminance of a plurality of beam images in the image, and determines that, for a beam image having a luminance to some extent smaller than the average, the opening size of the hole 80 is small.

The defect map generation unit 64 generates an always ON defect map or an always OFF defect map on the basis of defect determination results of the inspection regions (step S14). The shot data generation unit 66 refers to the defect map, and generates shot data such that the defects and the variations in the openings of the holes 80 are to be corrected.

In this manner, according to the present embodiment, each electron beam is inspected in a short period of time by dividing the blanking aperture array 10 into the plurality of inspection regions, by scanning a plurality of beams of each inspection region, and by successively switching the electron beams that are to pass through the through hole 42. A defect detection-classification can be performed in a short period of time and with high accuracy by changing the applied voltage of the blankers or the amount of deflection of the alignment coil 13 and by making a comparison as to whether a beam is detected.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
   an aperture plate in which a plurality of holes are formed and that forms multiple beams in a case where a charged particle beam passes through the plurality of holes;
   a blanking aperture array in which a plurality of blankers are arranged that switch ON-OFF of corresponding respective beams among the multiple beams;
   a stage on which a writing target substrate is placed and that is movable in XY directions;
   an inspection aperture that is provided at the stage and that allows one beam among the multiple beams to pass therethrough;
   a deflector that deflects the multiple beams;
   a current detector that detects a beam current of each of the multiple beams that has passed through the inspection aperture in a case where the multiple beams are scanned on the inspection aperture in the XY directions; and
   a control computing machine that generates a beam image based on the detected beam current and detects a defect of the blanking aperture array or the aperture plate based on the beam image,
   wherein the inspection aperture includes a through hole through which the one beam passes, and
   a diameter $\phi 1$ of the through hole satisfies a following condition:

$S < \phi 1 < P - S,$ wherein S is a beam size of the one beam, and P is a beam pitch of the multiple beams on the writing target substrate.

2. The apparatus according to claim 1, wherein the blanking aperture array is divided into a plurality of inspection regions, and the inspection aperture is scanned on an inspection region basis.

3. The apparatus according to claim 2, wherein the control computing machine recognizes beam array regions corresponding to the inspection regions in the beam images.

4. The apparatus according to claim 1, further comprising:
   an alignment coil that switches an operation mode to a normal mode in which the substrate is irradiated with beams that have not been deflected by the blankers or to an inversion mode in which the substrate is irradiated with beams that have been deflected by the blankers,
   wherein no beam is deflected in a case where a first predetermined voltage is applied to the blankers, and beams are deflected in a case where a second predetermined voltage is applied to the blankers, and
   the control computing machine determines a defect type by comparing beam images generated based on beam currents detected in a plurality of respective scans performed on the inspection aperture through switching of the operation mode and the presence or absence of deflection by the blankers.

5. The apparatus according to claim 4, wherein, in a case where a beam current corresponding to a blanker that is controlled such that the second predetermined voltage is applied is detected in the normal mode, the control computing machine determines that an always ON defect in which the first predetermined voltage is always applied has occurred in this blanker.

6. The apparatus according to claim 4, wherein, in the normal mode, in a case where no beam current of a beam corresponding to the blanker is detected both when the blanker is controlled such that the first predetermined voltage is applied and when the blanker is controlled such that the second predetermined voltage is applied, the control computing machine determines that an always OFF defect in which the substrate is not irradiated in the normal mode has occurred for this beam.

7. The apparatus according to claim 6, wherein, in a case where a beam current of the beam for which it has been determined that the always OFF defect has occurred is detected in the inversion mode, the control computing machine determines that a defect in which the second predetermined voltage is always applied has occurred in the blanker corresponding to this beam.

8. The apparatus according to claim 6, wherein, in a case where no beam current of the beam for which it is determined that the always OFF defect has occurred is detected in the inversion mode, the control computing machine determines that the hole of the aperture plate corresponding to this beam is closed.

9. The apparatus according to claim 1, wherein the control computing machine determines variations in openings of the holes formed in the aperture plate based on a luminance of each beam in the beam image.

10. A multi charged particle beam writing method comprising:
    emitting a charged particle beam;
    forming multiple beams by allowing the charged particle beam to pass through a plurality of holes of an aperture plate;
    performing, using a plurality of blankers provided at a blanking aperture array, blanking deflection on corresponding respective beams;
    scanning the multiple beams in XY directions on an inspection aperture that is provided at a stage on which a writing target substrate is placed, the inspection aperture allowing one beam among the multiple beams to pass therethrough;
    detecting a beam current of each of the multiple beams that has passed through the inspection aperture;
    generating a beam image based on the detected beam current; and detecting a defect of the blanking aperture array or the aperture plate based on the beam image,
wherein the inspection aperture includes a through hole through which the one beam passes, and
a diameter φ1 of the through hole satisfies a following condition:

$$S<\phi 1<P-S,$$

wherein S is a beam size of the one beam, and P is a beam pitch of the multiple beams on the writing target substrate.

11. The method according to claim 10, wherein the blanking aperture array is divided into a plurality of inspection regions, and the inspection aperture is scanned on each of the inspection regions basis.

12. The method according to claim 11, wherein beam array regions corresponding to the inspection regions are recognized in the beam images.

13. The method according to claim 10, further comprising switching an operation mode to a normal mode in which the substrate is irradiated with beams that have not been deflected by the blankers or to an inversion mode in which the substrate is irradiated with beams that have been deflected by the blankers,
wherein no beam is deflected in a case where a first predetermined voltage is applied to the blankers, and beams are deflected in a case where a second predetermined voltage is applied to the blankers, and
a defect type is determined by comparing beam images generated based on beam currents detected in a plurality of respective scans performed on the inspection aperture through switching of the operation mode and the presence or absence of deflection by the blankers.

14. The method according to claim 13, wherein, in a case where a beam current corresponding to a blanker that is controlled such that the second predetermined voltage is applied is detected in the normal mode, it is determined that an always ON defect in which the first predetermined voltage is always applied has occurred in this blanker.

15. The method according to claim 13, wherein, in the normal mode, in a case where no beam current of a beam corresponding to the blanker is detected both when the blanker is controlled such that the first predetermined voltage is applied and when the blanker is controlled such that the second predetermined voltage is applied, it is determined that an always OFF defect in which the substrate is not irradiated in the normal mode has occurred for this beam.

16. The method according to claim 15, wherein, in a case where a beam current of the beam for which it has been determined that the always OFF defect has occurred is detected in the inversion mode, it is determined that a defect in which the second predetermined voltage is always applied has occurred in the blanker corresponding to this beam.

17. The method according to claim 15, wherein, in a case where no beam current of the beam for which it is determined that the always OFF defect has occurred is detected in the inversion mode, it is determined that the hole of the aperture plate corresponding to this beam is closed.

18. The method according to claim 10, wherein variations in openings of the holes formed in the aperture plate are determined based on a luminance of each beam in the beam image.

* * * * *